(12) United States Patent
David

(10) Patent No.: US 7,269,025 B2
(45) Date of Patent: Sep. 11, 2007

(54) BALLOUT FOR BUFFER

(75) Inventor: Howard David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 304 days.

(21) Appl. No.: 11/026,606

(22) Filed: Dec. 30, 2004

(65) Prior Publication Data

US 2006/0146509 A1    Jul. 6, 2006

(51) Int. Cl.
*H05K 7/00* (2006.01)

(52) U.S. Cl. .................................. 361/760; 361/749

(58) Field of Classification Search ............... 361/760, 361/783, 789, 749–751, 780, 790, 784, 792–795; 257/686, 723, 777, 698, 700, 783; 174/253, 174/254, 260, 268
See application file for complete search history.

(56) References Cited

U.S. PATENT DOCUMENTS

| | | | |
|---|---|---|---|
| 6,243,272 B1 * | 6/2001 | Zeng et al. | 361/760 |
| 6,545,875 B1 * | 4/2003 | Perino et al. | 361/760 |
| 6,882,546 B2 * | 4/2005 | Miller | 361/783 |

OTHER PUBLICATIONS

R. F. Graf, Modern Dictionary of Electronics, Seventh Edition, 1999, p. 535.*

* cited by examiner

*Primary Examiner*—Dean A. Reichard
*Assistant Examiner*—Yuriy Semenenko
(74) *Attorney, Agent, or Firm*—Marger Johnson & McCollom P.C.

(57) ABSTRACT

In some embodiments, a multichip package includes mounting pads to mount devices, such as integrated circuits, to a substrate, such as a printed circuit board, so that devices mutually placed on opposite surfaces of the substrate do not have interfering connections or connection vias. Other embodiments are described.

23 Claims, 3 Drawing Sheets

BALLOUT FOR BUFFER

BACKGROUND

Electronic multichip packages have broad applications in fields such as personal and laptop computers. A popular multichip package is the dual inline memory module (DIMM) used for personal computer memory. The DIMM has a number of individual memory chips assembled on a rectangular printed circuit board (PCB), one example of what will be referred to here as a substrate. Input/output contacts are along one edge of the rectangular PCB. Such a package configuration is called a single-in-line package (SIP). For the SIP package, and generally any PCB or other substrate, electronic chips may be connected to both the front and back sides of the PCB. In particular, the DIMM typically has multiple memory chips connected to both sides of its PCB.

As the demand for smaller, more powerful computers continues, the density of electronic components increases. Electronic real estate is at a premium. Design features such as multilayer substrates have become commonplace to efficiently use substrate area. It is preferable to use all areas of a substrate such as a circuit board. It is generally not acceptable to design a circuit layout with unused areas. In addition, spacing of circuit features, such as integrated circuit chips, passive components, conductor traces, ground planes, and so on, becomes very dense, making conductor routing and general layout very challenging.

BRIEF DESCRIPTION OF THE DRAWINGS

Embodiments of the invention may be best understood by reading the disclosure with reference to the drawings.

DETAILED DESCRIPTION OF THE EMBODIMENTS

Figure 1:
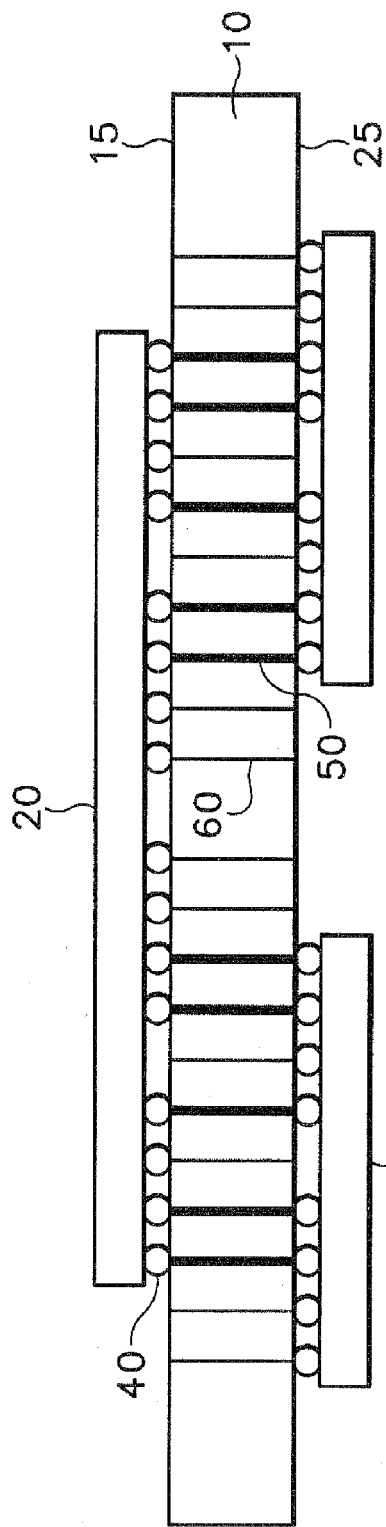
FIG. 1 shows a cross-section of an interconnection between a substrate and mounted devices, according to a conventional art.

In one current example of a multichip package, FIG. 1 shows a "registered" DIMM that utilizes a direct, non-buffered data connection between the DIMM memory devices and a DIMM connector. The registered DIMM traditionally has 9 dynamic RAM memory chips (DRAM's) on the front side and 9 DRAM's on the back side. Another memory technology called "fully buffered" DIMM (FB DIMM) is an improvement over the registered DIMM, but it adds a buffer circuit chip that occupies an area once held by two DRAM's on the front side of the DIMM substrate. The result is a DIMM with 8 DRAM's on the front side and 10 DRAM's on the back side. Two of the DRAM's are directly behind the buffer circuit chip that is on the front side of the DIMM. This overlapping of the chips on opposing sides of the DIMM results in interfering areas for connection vias. For example, connections for the buffer chip will be located directly below, or very near, connections for the DRAM's, causing location conflicts.

For example, the two DRAM's behind the buffer chip, with 60 solder balls each, may result in up to 120 locations where a via connected to a signal from an advanced memory buffer (AMB) would be in conflict with a via connected to a signal from the DRAM. To resolve this conflict issue, a solution would be to use blind vias. This allows a via to the front side of the DIMM to exist in the same x-y location on the DIMM as a different via to the back side of the DIMM. Unfortunately, blind vias are an expensive alternative that needs to be avoided to keep manufacturing costs low.

FIG. 1 shows a cross-section of a substrate 10 having a front device 20 mounted on a front side 15 of the substrate 10, and a back device 30 mounted on a back side 25 of the substrate 10. Connections between the substrate 10 and the front and back devices 20 and 30 may generally be made using interconnects 40, such as solder balls. In FIG. 1, two types of vias illustrate how mounted devices on a substrate may physically interfere with each other, as follows. Non-conflicting vias 60, represented by thin lines, are shown occurring in various locations across the substrate. Bold lines represent conflicting vias 50, which are vias that are functionally limited to the uncommon case of connecting between devices directly across from each other on opposite sides of the substrate. In other words, the location of a conflicting via is most likely an unusable area on both sides of the substrate. Thus, the occurrence of conflicting vias should be avoided: conflicting vias 50 among non-conflicting vias 60 presents difficult challenges to the circuit layout designer. Even a few conflicting vias may be problematic.

Figure 2:
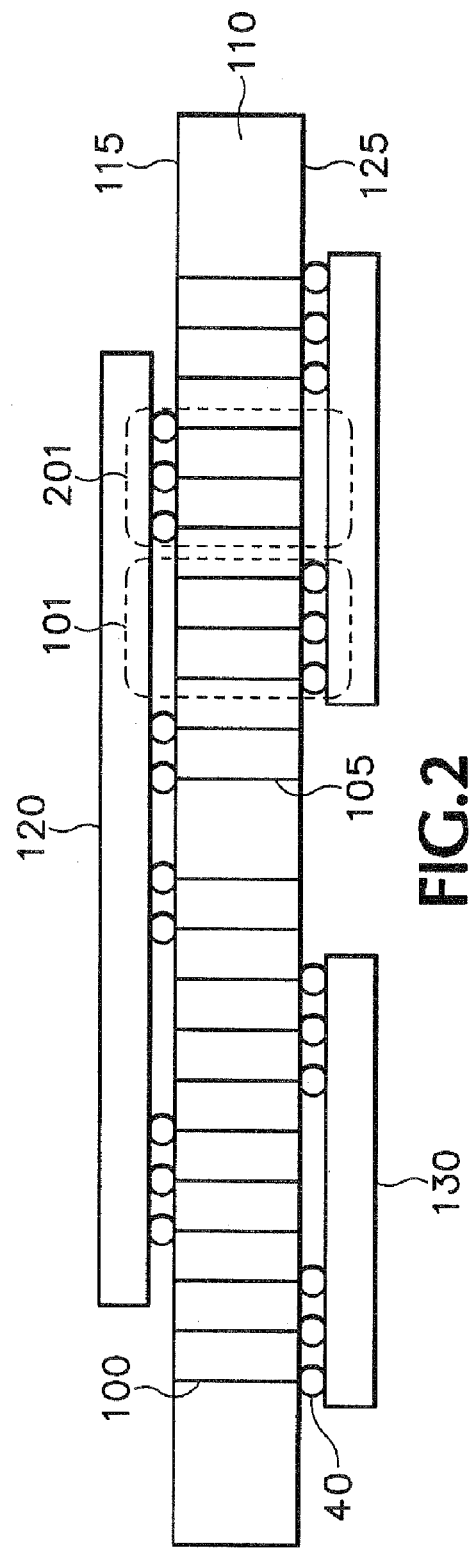
FIG. 2 shows a cross-section of an interconnection between a substrate and mounted devices, according to an embodiment of the invention.

FIG. 2 shows a cross-section of a system of mounted devices on a substrate 110. The mounted devices may be integrated circuits, such as DRAM's, SRAM's, buffer circuits, passive components, and so on. The substrate 110 may be a multilayer printed circuit board among many other types of substrates. Similarly, the mounting of the device to the substrate may be a ball grid array, among many other types of mountings.

In FIG. 2, a front device 120 is mounted on a front side 115 of the substrate 110, and a back device 130 is mounted on a back side 125 of the substrate 110. Connections between the substrate 110 and the front and back devices 120 and 130 may generally be made using interconnects 40, such as solder balls, on a connect pad.

Noticeable in FIG. 2 is that there are no conflicting vias. First vias 100, connecting to the back device 130, emerge on the opposite side of the substrate, the front side 115, in an area free of connections for the front device 120. Similarly, second vias 105, connecting to the front device 120, emerge on the opposite side of the substrate, the back side 125, in an area free of connections for the back device 130. In this fashion, devices on one side of the substrate may easily connect to a circuit laid upon a surface on the other side, or a layer, of the substrate by way of vias. Physical interference between a front device 120 and a back device 130 is easily avoided, easing a burden on a circuit layout designer.

FIG. 2 also illustrates an embodiment in which first vias 100 and second vias 105 are arranged in predetermined groups, thus creating a high circuit layout efficiency. In this embodiment, some of the first vias 100 may be organized into first groups 101 (back vias), and some of the second vias 105 may be organized into second groups 201 (front vias).

Figure 3:
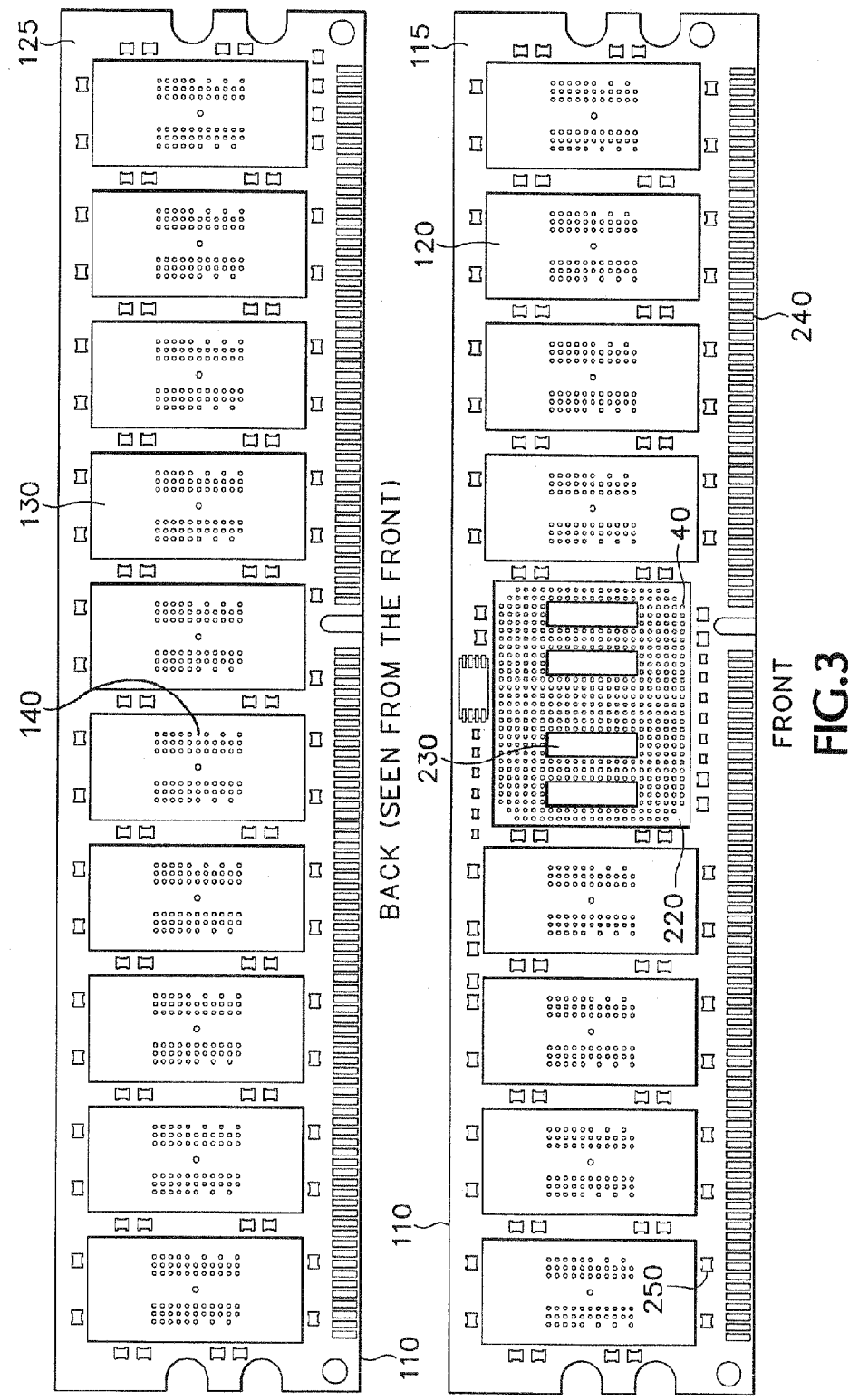
FIG. 3 is a plan view of a front and a back of a typical DIMM utilizing an embodiment of the invention.

FIG. 3 shows a front plan view and a back plan view, seen from the front, of a device utilizing an embodiment of the invention. Back devices 130 and front devices 120 are transparently depicted to show an underlying structure of the back side 125 and the front side 115 of the substrate 110, respectively. For completeness, circuit elements 250 and contacts 240 are also shown. Back devices 130 and front devices 120, which may be DRAM's, are mounted to the back side 125 and front side 115, respectively, of the substrate 110. In the embodiment of FIG. 3, back and front devices 130 and 120 may be integrated circuits, and circuit elements 250 may be resistors, capacitors, or other passive or active elements. The substrate may be a printed circuit board that is multi-layered. Shown on the front side 115 of the substrate 110 of the particular embodiment in FIG. 3 is a window region 220 having four windows 230. There may be one or more windows with any combination of length and width. The window region 220 has interconnects 40, such as solder balls, distributed throughout its area excluding the windows 230. Vias from the front side 115 to the back side 125 may exist at every interconnect 40. In the embodiment shown in FIG. 3, the windows 230 have no interconnects and would therefore not have associated vias. In some embodiments of the invention the window region 220 may have one or more no-connects 140, which may be solder balls used only for mechanical connections not electrical connections. No-connects are beneficial for increasing a mechanical robustness of a device mounting.

In the embodiment shown in FIG. 3, it can be seen that interconnects 40 from the back side 125 are present in the area directly opposite the windows 230 on the front side 115; and there are no interconnects 40 from the front side 115 present in these same windows 230. In other words, the presence or absence of interconnects from opposite sides of the substrate complement each other.

In the embodiments illustrated in this disclosure, it can be assumed that a via may exists at every interconnect 40. However, the invention is not limited to such embodiments, and, in general, via locations are independent of both interconnect locations and connect pads.

In this disclosure, a no-connect 140 may refer to two possibilities; (1) A no-connect 140 may be a blank area on the substrate with no connecting solder ball and no connect pad, or (2) A no-connect 140 may be a solder ball or a connect pad that is used only for a mechanical connection, not an electrical connection, and has no via at its location.

Figure 4:
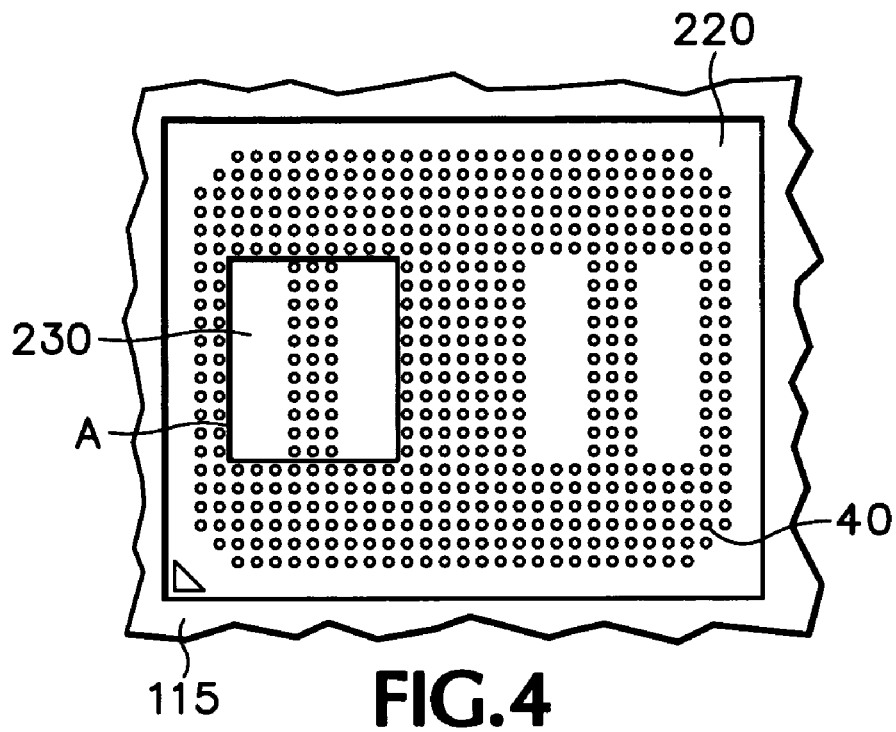
FIG. 4 is a close-up plan view of a portion of the front of the substrate shown in FIG. 3.

FIG. 4 is a close-up view of FIG. 3 of the portion of the front side 115 of the substrate 110 including the window region 220. In the embodiment of the invention shown in FIGS. 3 and 4, a window is three balls wide and eleven balls long. The windows 230 are arranged in pairs spaced seven balls apart. Each window of a pair is spaced three balls apart. For reference, an area A demarcates the pair of windows and the small window region in between.

Figure 5:
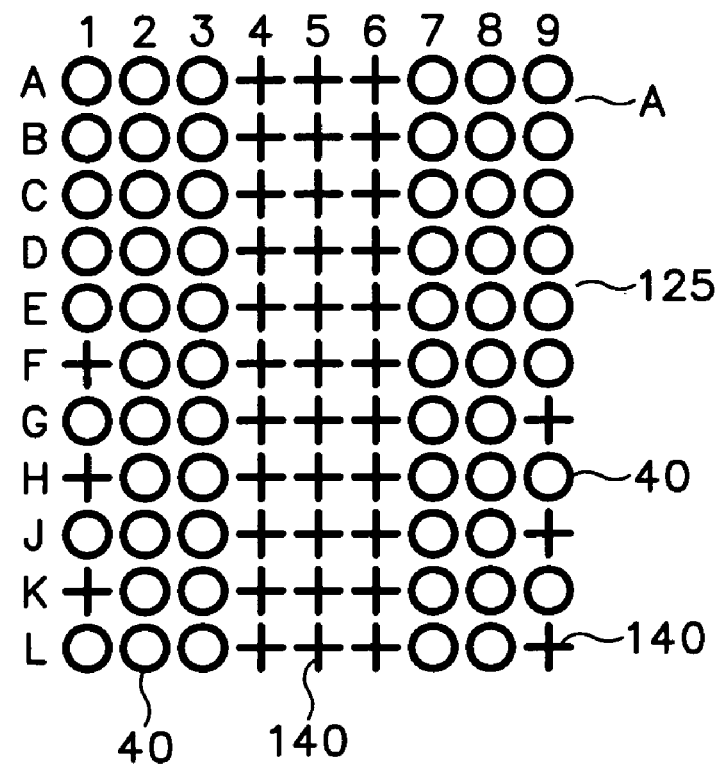
FIG. 5 is a close-up plan view of a portion of the window region of FIG. 3, as seen from the back.

FIG. 5 shows a view of area A of FIG. 4, as viewed from the back side 125. This view from the back includes the corresponding areas on the back side 125 of one pair of windows 230 (that are on the front side 115) and the corresponding area on the back side 125 of a portion of the window region 220 between each window 230 of the pair. A symbol "+" refers to a no-connect 140 and a symbol "O" refers to an interconnect 40. The symbol "+" may also refer to a no-connect pad and a symbol "O" may refer to a connect pad. Columns are numbered 1-9 and rows are labeled A-L. It should be noted that locations of no-connects 140 and interconnects 40 are oppositely located when comparing the front side 115 with the back side 125 in area A, as shown in FIGS. 4 and 5, respectively. There are shown a few exceptions, namely several no-connects 140 mixed with interconnects 40 in FIG. 5, and this will be explained shortly. In one embodiment of the invention each window of the pair is spaced three balls apart, and each window is eleven balls long. The only portion of the window region 220 that is shown in FIG. 5 is the 3×11 array of no-connects 140, between each window of the pair.

In FIG. 5, the 3×11 array of no-connects 140 on the front side 115 of the substrate 110, is directly opposite a connection area for one or more back devices 130 that are on the back side 125 of the substrate 110 in one embodiment. Therefore, connections of the back devices 130 do not physically interfere with any vias or connections of a front device 120 on the front side 115 of the substrate 110. Specifically shown in FIG. 5, no-connects of columns 4, 5, and 6 occupy an area of the substrate 110 that is also a portion of the window region 220. These columns may be used for electrical connections for one or more front devices 120 on the opposing side of the substrate such as the front side 115.

The two windows 230 shown in FIG. 4 correspond to the array of interconnects 40 or connect pads of the columns 1-3 and 7-9, respectively, that are on the back side 125, as shown in FIG. 5. These interconnects 40 or connect pads are for electrical connections to one or more back devices 130.

In this embodiment, better results may be obtained if there are no solder balls or corresponding vias, but only no-connects 140, in the area of the back side 125 that is directly opposite the area occupied by the window region 220 on the front side 115. However, in this directly opposite area there may be interconnects 40 and their vias or other connection means, perhaps interspersed.

FIG. 5 also shows an example of an embodiment of the invention with several no-connects 140 on the back side 125 within the windows 230 that are on the front side 115. Specifically, column 1 has no-connects 140 at rows F, H, and K, and column 9 has no-connects 140 at rows G, J, and L. These no-connects 140 may be useful for mechanical connections to increase mechanical robustness of the device mounting. There may be zero or more no-connects 140 in a window on the back side 125.

An embodiment of the invention may have a substrate 110 having a front side 115, a back side 125, a first group of vias 101, and a second group of vias 201. A front device 120 is connected on the front side 115, and a back device 130 is connected on the back side 125. The front device 120 corresponds to the first group of vias 101 and the back device 130 corresponds to the second group of vias 201. A window region 220 and a window 230 are on the front side 115 of the substrate 110. The window region 220 contains the first group of vias 101, and the window 230 contains the second group of vias 201. The window region 220 and the window 230 are exclusive of each other.

The substrate 110 may have mounting pads on the back side 125 and front side 115. Each mounting pad may have connection vias, wherein the connection vias of a mounting pad on the front are in different locations on the substrate than the connection vias of a mounting pad on the back.

Although there has been described to this point a particular embodiment for mounting devices to a substrate in a multichip package, it is not intended that such specific references be considered as limitations upon the scope of this invention except in-so-far as set forth in the following claims.

What is claimed is:

1. An apparatus comprising:
   a substrate having a front and a back, and having a window area on the front; interconnects and no-connects within the window area;

at least one front mounting pad to receive a front device having interconnects on the front, and at least one back mounting pad to receive a back device having interconnects on the back, wherein the front mounting pad is disposed opposite the back mounting pad in an overlapping fashion, and wherein the interconnects on the front and the interconnects on the back are between the overlapping front and back mounting pads; and one or more contiguous regions within the window area having no-connects that substantially align with interconnects of the at least one back mounting pad.

2. The apparatus of claim 1 wherein the at least one front mounting pad has interconnects within the window area.

3. The apparatus of claim 1 wherein each of the one or more contiguous regions has N×M no-connects, where N and M are each an integer.

4. The apparatus of claim 3 wherein N is any integer number in the range of 2-5, and M is any integer number in the range of 8-14.

5. The apparatus of claim 1 wherein the front device is mounted to overlap the back device.

6. An apparatus comprising:
a substrate having a front side and a back side, and having a first group of vias and a second group of vias;
a front mounting pad to receive a front device connected on the front side, and a back mounting pad to receive a back device connected on the back side, the front mounting pad corresponding to the first group of vias and the back mounting pad corresponding to the second group of vias; and
a window region and at least one window on the front side of the substrate, the window region containing the first group of vias, and the at least one window containing the second group of vias, the window region and the at least one window being exclusive of each other, wherein the entire window region is between the front mounting pad and the back mounting pad.

7. The apparatus of claim 6 wherein the at least one window is inside the window region.

8. The apparatus of claim 7 wherein the at least one window comprises interconnects and no-connects.

9. The apparatus of claim 7 wherein a region between a pair of the at least one window comprises interconnects, and the at least one window comprises no-connects.

10. The apparatus of claim 7 wherein the window region comprises interconnects, and the at least one window comprises no-connects.

11. The apparatus of claim 6 wherein the back device is one selected from the group consisting of: an integrated circuit, and a DRAM.

12. The apparatus of claim 6 wherein the front device is one selected from a group consisting of: an integrated circuit, and a buffer.

13. The apparatus of claim 6 wherein the substrate is one selected from the group consisting of: a multilayer substrate, a printed circuit board, an aluminum-based ceramic board, a plastic glass laminated substrate, a tape-based substrate, and a flexible printed circuit board.

14. The apparatus of claim 6, wherein the substrate uses ball grid array mounting.

15. An apparatus comprising:
a substrate having a front and a back; and
a mounting pad on each of the front and the back, each mounting pad having connection vias, wherein the connection vias of the mounting pad on the front are in different locations on the substrate than the connection vias of the mounting pad on the back, and wherein the mounting pad on the front entirely overlaps the mounting pad on the back.

16. The apparatus of claim 15, wherein the substrate is multilayer.

17. The apparatus of claim 15, wherein the substrate is a printed circuit board.

18. A multichip package comprising:
a substrate having a front and a back;
at least one mounting pad on each of the front and the back, each mounting pad configured to mount an integrated circuit chip;
a window region on the front having at least one window, the at least one window located directly opposite a number of the at least one mounting pad on the back;
front vias in the window region exclusive of the at least one window, the front vias configured to connect to a chip mounted on the front; and
back vias in the at least one window exclusive of the window region, the back vias configured to connect to a chip mounted on the back, wherein the front vias and the back vias are between the chip mounted on the front and the chip mounted on the back.

19. The multichip package of claim 18, wherein the substrate is multilayer.

20. The multichip package of claim 18, wherein the substrate is a printed circuit board.

21. The multichip package of claim 18, wherein the chip mounted on the back is a DRAM.

22. The multichip package of claim 18, wherein the chip mounted on the front is a buffer.

23. The multichip package of claim 18, wherein the substrate uses ball grid array mounting.

* * * * *